United States Patent [19]
Horigan et al.

[11] Patent Number: 6,157,233
[45] Date of Patent: Dec. 5, 2000

[54] ALWAYS-DETERMINISTIC PHASE-LOCKED LOOP

[75] Inventors: John W. Horigan, Mountain View; Rajendra M. Abhyankar, Santa Clara, both of Calif.

[73] Assignee: Intel Corporation, Santa Clara, Calif.

[21] Appl. No.: 09/212,541

[22] Filed: Dec. 16, 1998

[51] Int. Cl.[7] ...................................................... H03L 7/00
[52] U.S. Cl. ............................................................ 327/163
[58] Field of Search .............................. 327/41, 291, 292, 327/295, 296, 297, 141, 142, 144, 145, 163; 713/300, 320, 322; 395/556, 558, 878

[56] References Cited

U.S. PATENT DOCUMENTS

| | | | |
|---|---|---|---|
| 5,630,107 | 5/1997 | Carmean et al. | 395/560 |
| 5,634,116 | 5/1997 | Singer | 395/551 |
| 5,862,373 | 1/1999 | Pathikonda et al. | 395/556 |
| 5,926,053 | 7/1999 | McDermott et al. | 327/298 |
| 5,935,253 | 8/1999 | Conary et al. | 713/322 |
| 6,021,500 | 2/2000 | Wang et al. | 713/320 |

*Primary Examiner*—My-Trang Nuton
*Attorney, Agent, or Firm*—Alan K. Aldous

[57] ABSTRACT

In some embodiments, the invention includes a system having a normal operating mode and a suspend mode. The system includes event recognition circuitry to provide an event status signal. The system also includes clock generating circuitry with selective stretching capability to generate an internal clock signal and to receive the event status signal, and wherein when the event status signal has a first logic state, the clock generating circuitry stretches the internal clock signal by a number of phases per cycle of a bus clock signal wherein an alignment relationship between the internal clock signal and the bus clock signal is immediately deterministic in transitions between the suspend mode and the normal operating mode.

22 Claims, 9 Drawing Sheets

ALWAYS-DETERMINISTIC PHASE-LOCKED LOOP

BACKGROUND OF THE INVENTION

1. Technical Field of the Invention

The present invention relates to phase-locked loops and, more particularly, to an always deterministic phase-locked loop.

2. Background Art

Processors, such as microprocessors, typically have at least one core clock signal and at least one bus clock signal. The ratio of the bus clock frequency to the core clock frequency is sometimes expressed as 1/n or 2/n. For example, in the case in which there are 4 and ½ cycles of the core clock signal for every cycle of the bus clock signal, the ratio is 2/9 or 2/n, where n is 9. FIGS. 1 and 2 are examples of 2/n ratios. In the case in which there are only 4 cycles of the core clock signal for every cycle of the bus clock signal, the ratio is 1/4 or 1/n, where n is 4.

Processors typically use a phase-locked loop (PLL) to generate core clock signals. In current Pentium® II processors, manufactured by Intel Corporation, when the processor is started, the PLL is not synchronized to the bus clock signal. Accordingly, for electronics outside the processor running in a 2/n ratio, it is not known whether a particular bus clock rising edge is aligned or misaligned with the core clock signal. A process triggered by an external event is used to determine the relationship between the core clock and bus clock signals. Referring to FIG. 1, a bus clock signal (busclk) includes some rising edges that are aligned with a core clock signal and some rising edges that are not aligned. The rising edges of the bus clock signal alternate between being aligned and misaligned.

Since the processor's response to external events will be slightly different if they happen on aligned or misaligned edges, the PLL is synchronized before the processor is tested.

A synchronizing external event (e.g., RESET# deassert, SLP# (sleep) deassert#, BPRI# (Priority-agent Bus Request) assert etc.) is used. The PLL samples the phase relationship between the core clock and bus clock signals and stretches the core clock a phase, if necessary, to synchronize the aligned edges with the external event. The term "phase" refers to a section of the signal from one edge to the next (e.g., rising edge to falling edge as illustrated in FIG. 1). This process takes three cycles of the bus clock.

For example, referring to FIGS. 1 and 2, following the rising edge of phase 1 (called the external event phase), the synchronizing external event occurs. Following the rising edge of phase 2 (called the sample phase), the phase relationship between the core clock and bus clock signals are sampled. In FIG. 1, the core and bus clocks are not aligned at the sample phase. In FIG. 2, the core and bus clocks are in aligned at the sample phase. Phase 3 of the bus clock is referred to as the potential stretching phase. Under one scheme, the core clock is stretched by one phase following the rising edge of the potential stretching phase, when the core clock and bus clocks are aligned at the sample phase, and the core clock is not stretched when the core clock and bus clocks are not aligned at the sample phase. Accordingly, in FIG. 1, the core clock is not stretched and in FIG. 2, and the core clock is stretched following the rising edge of the phase 3 of the bus clock. At and following phase 4 of the bus clock, the alignment relationship between the aligned and misaligned edges of the core and bus clocks is deterministic (predictable), although the bus clock alternates between being aligned and unaligned with each cycle.

Disadvantages of the prior art include that in suspend mode of the processor, the alignment relationship between core clock and bus clock is not deterministic. Further, as described, after the processor changes from suspend to normal operating mode, it takes three cycles for the alignment relationship between the core clock and bus clock to be deterministic.

SUMMARY

In some embodiments, the invention includes a system having a normal operating mode and a suspend mode. The system includes event recognition circuitry to provide an event status signal. The system also includes clock generating circuitry with selective stretching capability to generate an internal clock signal and to receive the event status signal, and wherein when the event status signal has a first logic state, the clock generating circuitry stretches the internal clock signal by a number of phases per cycle of a bus clock signal wherein an alignment relationship between the internal clock signal and the bus clock signal is immediately deterministic in transitions between the suspend mode and the normal operating mode.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

The invention involves an always deterministic PLL. In some embodiments, the invention involves a processor that produces a core clock in an ordinary operating mode and in at least one suspend mode. The suspend mode may be initiated as part of a Reset, Sleep, or Quick Start mode. In suspend mode, circuitry (such as a digital PLL) stretches the core clock a number of phases each bus clock cycle.

Figure 1:
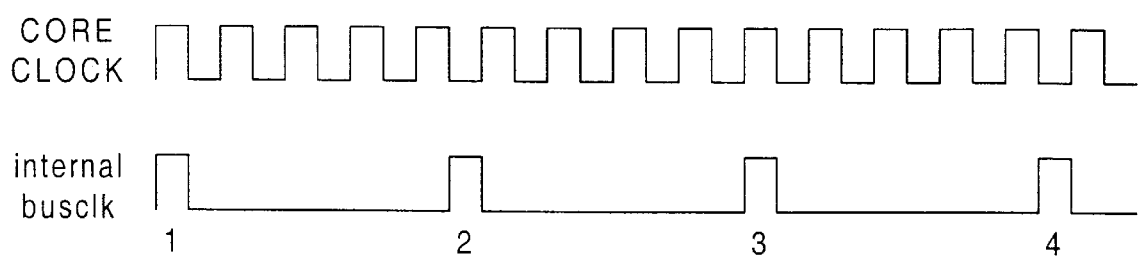
FIG. 1 is a graphical representation of a prior art core clock and bus clock in a 2/9 ratio having a first relationship.
Figure 2:
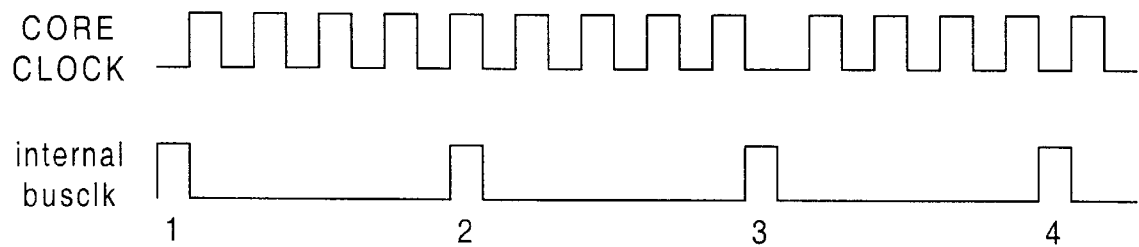
FIG. 2 is a graphical representation of a prior art core clock and bus clock in a 2/9 ratio having a second relationship.
Figure 3:
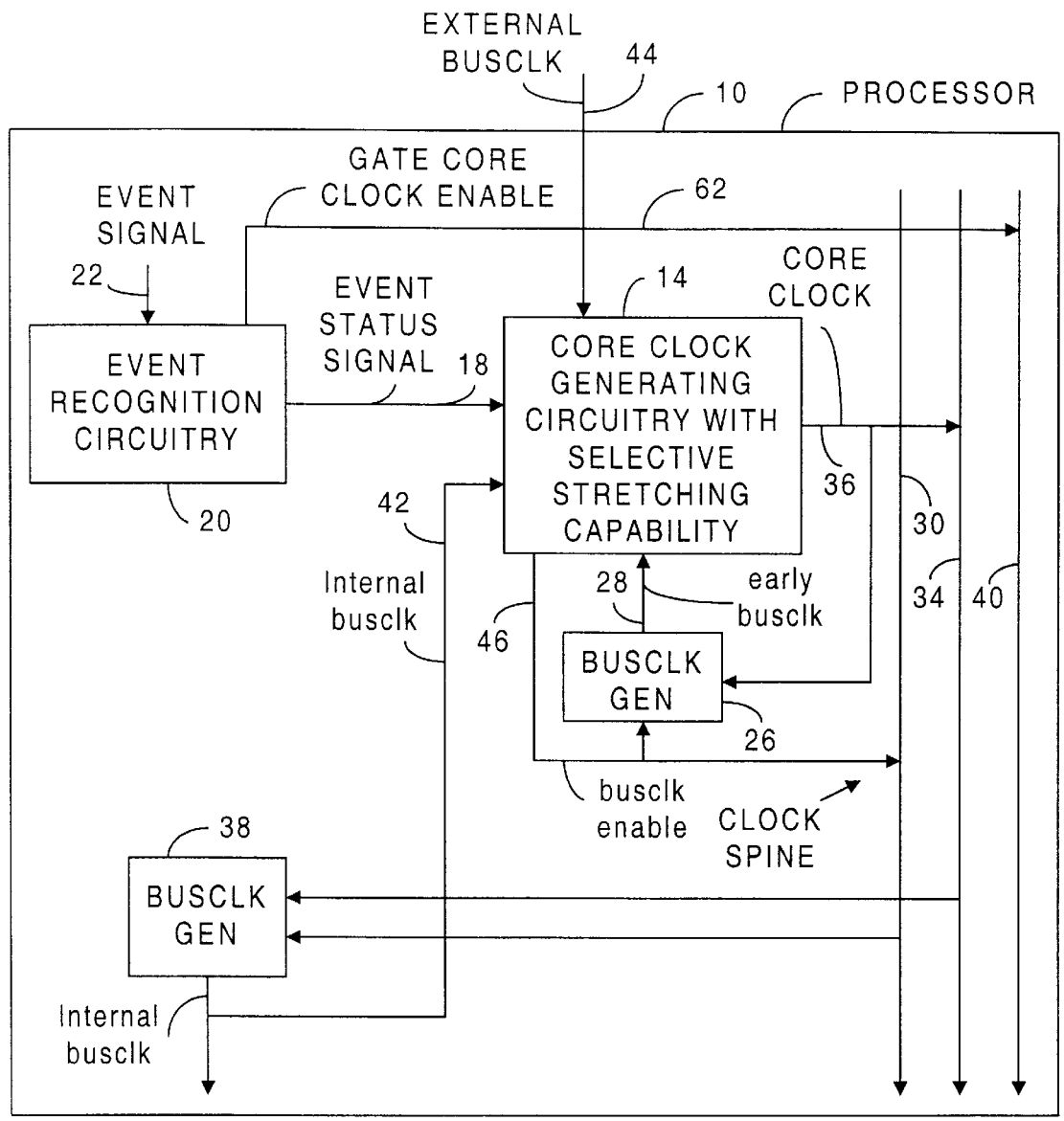
FIG. 3 is a schematic block diagram representation of circuitry in a processor according to some embodiments of the invention.

FIG. 3 illustrates some embodiments of certain circuitry in a processor 10 used to produce the core clock in the ordinary operating mode and in the suspend mode(s). Various other circuitry may be used to produce the core clock and other signals described herein. Processor 10 includes core clock generating circuitry with selective stretching capability 14 (referred to as core clock generating circuitry 14) that produces a core clock signal on conductor 36 which is provided to a bus clock generator 38 via a conductor 34 on a clock spine. The clock spine includes conductors 30, 34, and 36. Bus clock generator 38 also receives a bus clock enable signal (busclk enable) on a conductor 30 of the clock spine from conductor 46 and produces a bus clock signal (busclk). The busclk enable is produced by a PLL digital section in core clock generating circuitry 14 and is also provided to a bus clock generator 26 which produces an early bus clock signal (early busclk) which is received by core clock generating circuitry 14 on a conductor 28.

Figure 4:
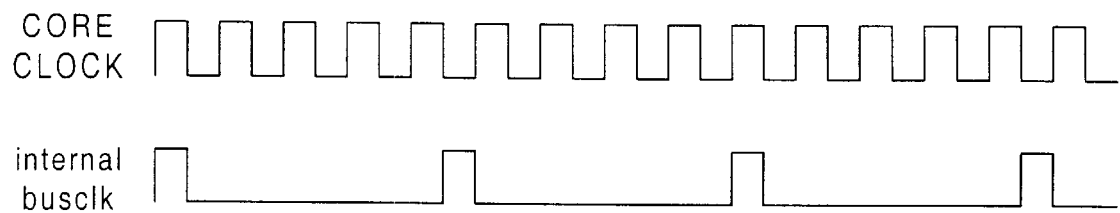
FIG. 4 is a graphical representation of a core clock and bus clock in a 2/9 ratio in ordinary operating mode as produced in some embodiments of the invention.
Figure 5:
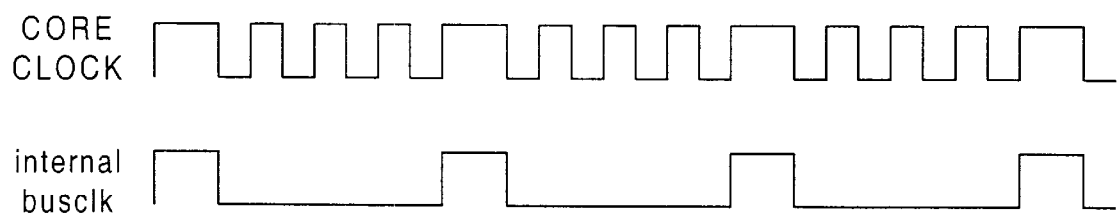
FIG. 5 is a graphical representation of a core clock and bus clock in a suspend mode with a pseudo 1/4 ratio as produced in some embodiments of the invention.
Figure 6:
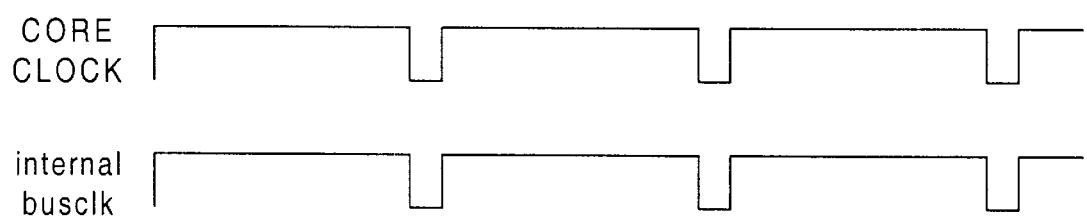
FIG. 6 is a graphical representation of a core clock and bus clock in a suspend mode as produced in some embodiments of the invention.

In ordinary operating mode, core clock generating circuitry 14 does not stretch the core clock; and in a 2/9 mode, the core clock and busclk may look as in FIG. 4. There are different possible suspend modes. However, in each suspend mode, the core clock is stretched by at least one phase. In some embodiments, the busclk also may be stretched by the same amount because it is generated in response a rising edge of the core clock. In FIG. 5, the core clock is stretched by one phase and may be termed a pseudo 1/4 mode relationship because there are four cycles of the core clock (albeit with one stretched) for each busclk cycle. In FIG. 6, the core clock is stretched by seven phases, and the core clock and busclk of FIG. 6 may be termed a pseudo 1/1 mode. Other amounts of stretching may be used. For example, circuitry 14 could have stretched the core clock by five phases to a pseudo 1/2 ratio mode. This effectively shifts the processor to a lower 1/n ratio mode while maintaining the PLL phase lock to the original 2/n ratio.

Unlike in the prior art, the alignment relationship between the core and busclk signals is deterministic (known) in suspend mode. Further, in ordinary mode, the alignment relationship between the core and busclk signals is deterministic immediately after the transition from a suspend mode to ordinary mode. This is in contrast to the prior art in which it takes three bus clock cycles for the alignment relationship to be deterministic as describe above. By immediate, it is meant within one bus clock. In some embodiments, the alignment relationship is always deterministic meaning in suspend mode(s) and normal mode(s).

An additional advantage of a suspend mode involving stretching by more than one phase is that less power is consumed. Accordingly, less power may be used in the suspend mode of FIG. 6 than in the suspend mode of FIG. 5. In some embodiments, the processor has only one normal operating mode and only one suspend mode. In other embodiments, the processor may have more than one operating mode, such as different frequencies, and/or have the capability to enter different suspend modes.

Referring to FIG. 3, whether core clock generating circuitry 14 produces the core clock in ordinary mode or a suspend mode depends on the state of an event status signal on conductor 18. The event status signal is controlled by event recognition circuitry 20. In some embodiments, if the event status signal is a "0," core clock generating circuitry 14 is in ordinary operating mode, and if the event status signal is a "1," core clock generating circuitry 14 is in a suspend mode. In other embodiments, the event status signal may have more than merely two values and different suspend modes may be entered.

An event signal(s) on conductor(s) 22 received by event recognition circuitry 20 may control the state of event status signal 18. Event signal(s) on conductor(s) 22 may be responsive to external event signals such as signals indicating processor 10 should go into a sleep mode, deep sleep mode, wake up mode, etc. Such signals may be, for example, RESET# deassert, SLP# (sleep) deassert#, BPRI# (Priority-agent Bus Request) assert, etc.

Figure 7:
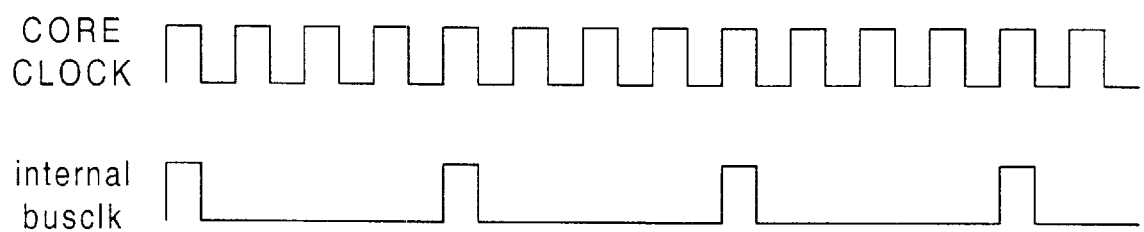
FIG. 7 is a graphical representation of a core clock and bus clock in a 1/4 ratio in ordinary operating mode as produced in some embodiments of the invention.
Figure 8:
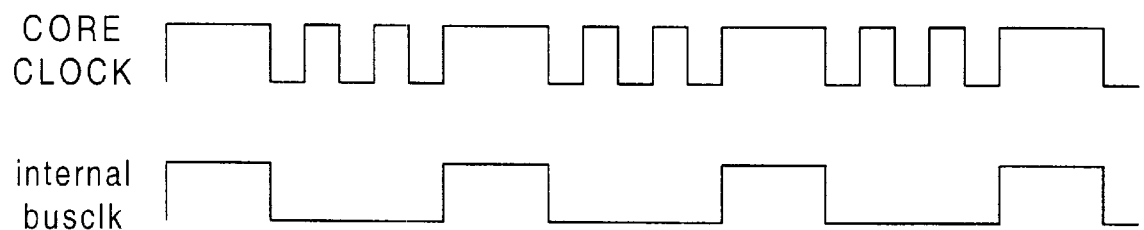
FIG. 8 is a graphical representation of a core clock and bus clock in a suspend mode as produced in some embodiments of the invention.
Figure 9:
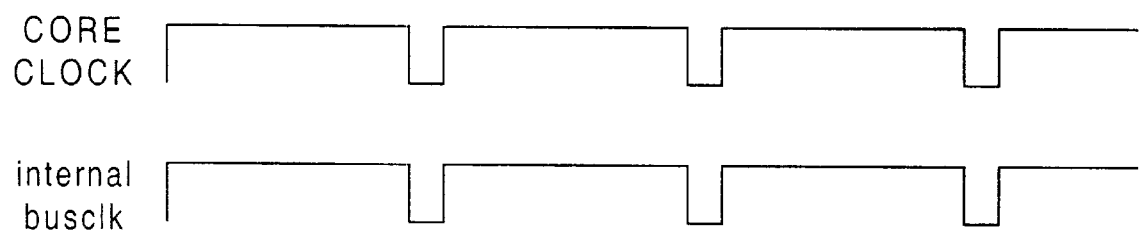
FIG. 9 is a graphical representation of a core clock and bus clock in a suspend mode as produced in some embodiments of the invention.

Although a core clock and busclk in a 1/4 mode (as opposed to a pseudo 1/4 mode) may be deterministic even without the invention, such signals may be used in connection with invention. For example, core clock generating circuitry 14 may reduce a 1/n ratio to a lower pseudo 1/n ratio to reduce power in, for example, a Sleep or Quick Start mode by, for example, stretching the core clock by an even number of clock phases. For example, FIG. 7 illustrates a core clock and busclk in a 1/4 mode. FIG. 8 illustrates the same signals in a pseudo 1/4 mode and FIG. 9 illustrates the same signals in a pseudo 1/1 mode. Processor 10 may produce the signals of FIG. 7 in ordinary operating mode and the signals of FIG. 8 or 9 in a suspend mode.

Figure 10:
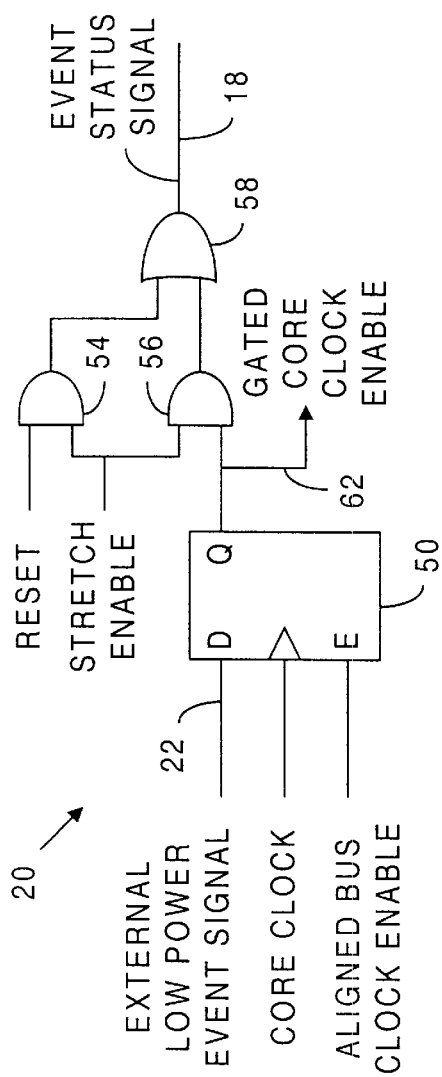
FIG. 10 is a schematic block diagram representation of an embodiment of the event recognition circuitry of FIG. 3.
Figure 11:
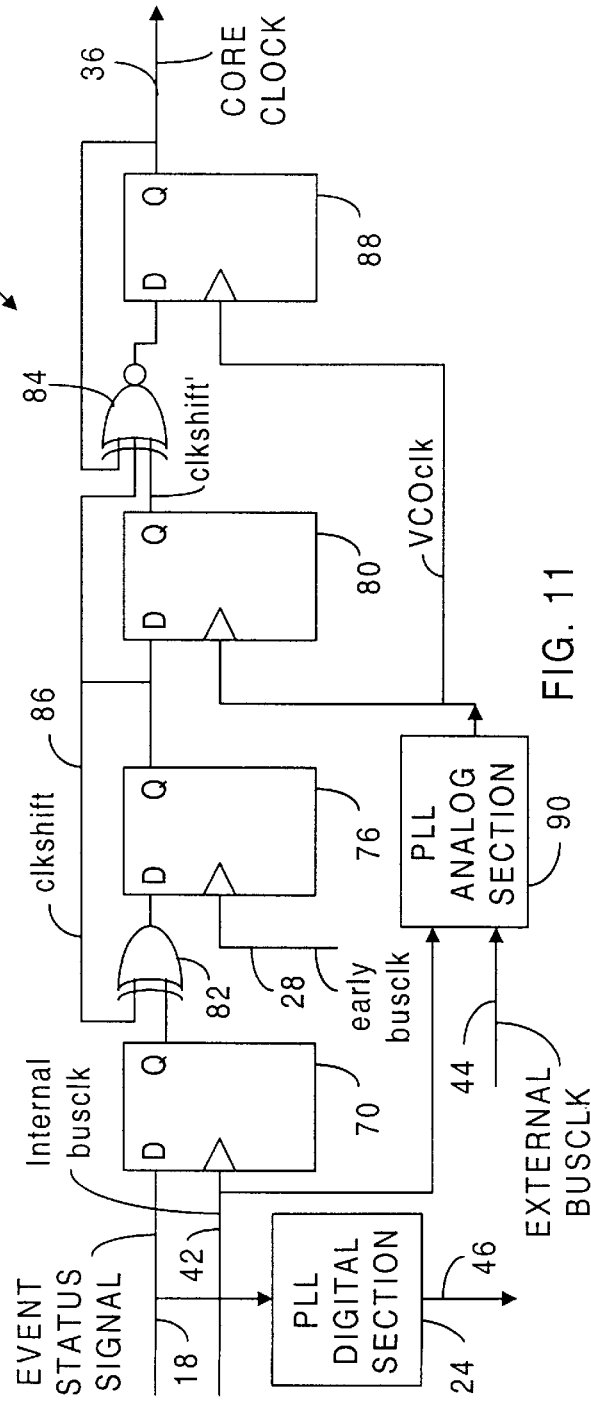
FIG. 11 is a schematic block diagram representation an embodiment of the core clock generating circuitry of FIG. 3.

FIG. 10 illustrates an embodiment of event recognition circuitry 20. Various other embodiments might be used. FIG. 11 illustrates an embodiment of core clock generating circuitry 14. Various other embodiments might be used. FIG. 11 shows a simplified schematic for a. PLL capable of stretching one clock phase. Event recognition circuitry 20 generates the gated core clock enable signal (gated core clock enable) on conductor 62 and the event status signal on conductor 18 that indicates to the PLL of core clock generating circuitry 14 to switch to pseudo-1/n mode, which is an example of a stretch mode. The gated core clock enable signal is provided on conductor 62 to conductor 40 of the clock spine. Circuitry (not shown) generates the gated core clock in response to the gated core clock enable signal.

In some embodiments, the core clock signal at the clock input of flip flop 50 is the core clock of the output of core clock generating circuitry 14 after it is passed through the clock spine and peripheral circuitry (not shown). The stretch enable signal at the input of AND gates 54 and 56 is high when it is desired to stretch the signal, assuming the external low power event signal is asserted on conductor 22. In 1/n mode, the stretch enable signal may be high when it is desired to stretch to save power even though the alignment relationship would be deterministic even without stretching.

Flip flop 50 samples an event signal such as, for example, an external lower power event signal on conductor(s) 22 on aligned bus clock edges. This may be done to turn the gated core clock on and off on aligned edges and turn pseudo-1/n mode on at an aligned bus clock edge. In some embodiments, this is not done with Reset for three reasons: gated core clock is not turned off during Reset; reset is asserted asynchronously; and reset is synchronously deasserted in pseudo-1/n mode or true 1/n mode, so all bus clock edges are already aligned. In some embodiments, the event status signal is not asserted in 1/n mode. In other embodiments, it may be.

Figure 12:
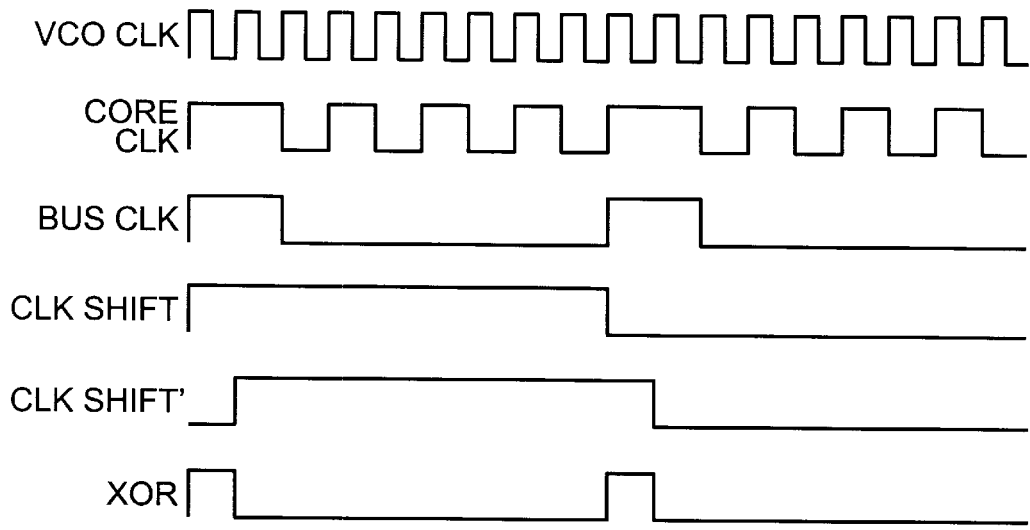
FIG. 12 is a graphical representation of a signals of FIGS. 3, 10, and 11 involved in the generation of a pseudo 1/4 clock according to some embodiments of the invention.

Referring to FIG. 11, core clock generating circuit 14 generates the toggling clkshift signal on conductor 86 when the event status signal is asserted. Flip flop 70 delays the event status signal by one bus clock to give the event status signal time to propagate to logic that needs to be prepared for pseudo-1/n mode. PLL analog section 90 provides the VCOclk signal. PLI, analog section 90 assists in generating the core clock as a multiple of the external clock (external busclk) and aligns of a rising edge of the core clock with the external bus clock. FIG. 12 illustrates how rising and falling edges on clkshift cause phases to be stretched on the core clock. One concern is that between flip flop 76 and 80, clkshift is going from the busclk domain to the VCOclk domain and that there may be a significant phase difference between the two. Clocking flip flop 76 with an early version of busclk may solve this problem. Clkshift' is at the output of flip flop 80. The XOR signal is the XOR of clkshift and clkshift'. An external busclk signal is received on conductor 44 by PLL analog section 90. There could be an intermediate circuitry such as a buffer. PLL digital section 24 produces the busclk enable signal on conductor 46.

Those skilled in the art, having the benefit of this disclosure, may implement a design of core clock generating circuitry 14 that stretches the core clock by more than one phase. For example, additional logic between flip flop 80 and 88 would facilitate stretching by more than one clock phase. XOR logic 84 and the connections of associated conductors may be somewhat modified.

Figure 13:
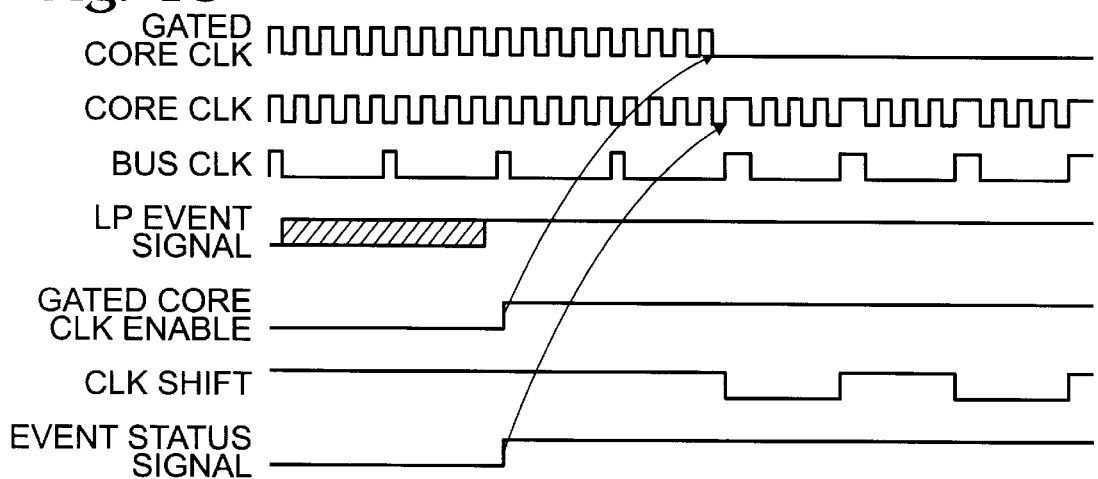
FIG. 13 is a graphical representation of signals of FIGS. 3, 10, and 11 while the processor goes to sleep in a 2/9 mode in some embodiments of the invention.
Figure 14:
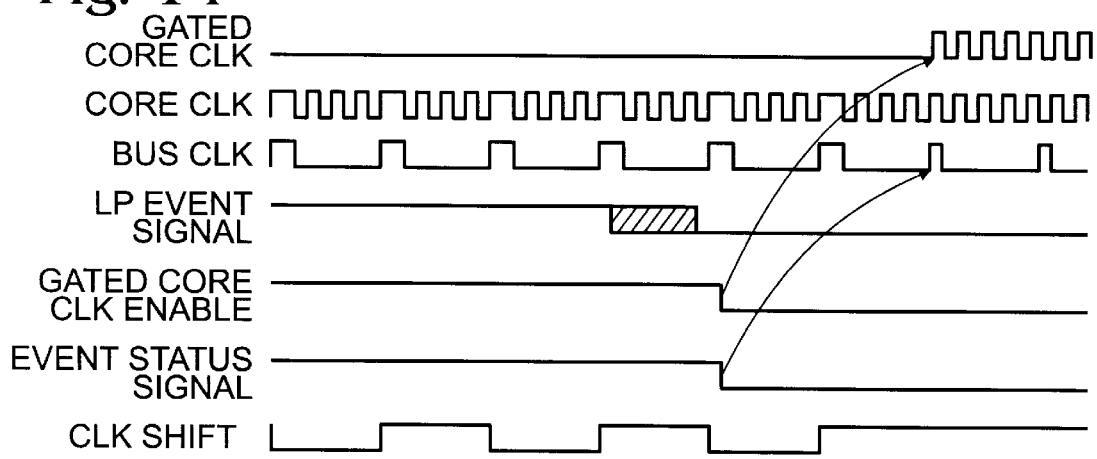
FIG. 14 is a graphical representation of signals of FIGS. 3, 10, and 11 while the processor wakes up in a 2/9 mode in some embodiments of the invention.
Figure 15:
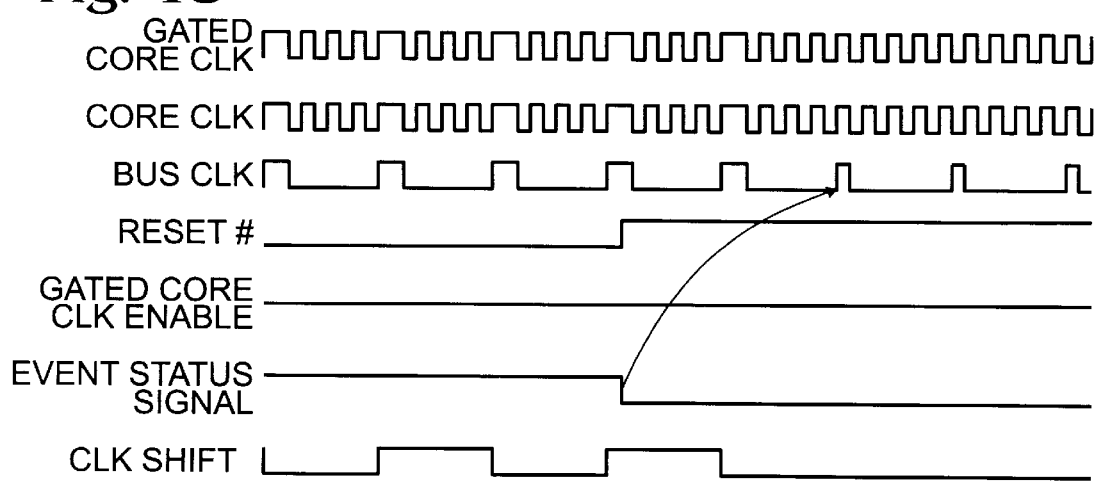
FIG. 15 is a graphical representation of signals of FIGS. 3, 10, and 11 while to processor is reset in a 2/9 mode in some embodiments of the invention.

FIG. 13 illustrates the transition to the Sleep or Quick Start mode from the ordinary operating mode. In the example, the external lower power even signal is sampled on an aligned bus clock edge and drives the core clock gated signal on conductor 62, which turns off the gated core clock two bus clocks later. In the example, the event status signal is asserted at the same time as gated core clock enable is deasserted and causes core clock generating circuitry 14 to switch to pseudo-1/4 mode just after gated core clock turns off. FIG. 14 illustrates an example of the transition back to the ordinary operating mode, or Stop Grant or HALT/Grant Snoop mode, which are optional. The low power event signal deassertion may cause deassertion of event status signal on the next bus clock edge, since all bus clock edges are aligned. Core clock generating circuitry 14 switches back to 2/n mode and gated core clock turns on two bus clocks later. In some embodiments, this meets the timing requirements to support snoops in the Quick Start mode. FIG. 15 shows the transition from Reset to the ordinary operating mode. Core clock generating circuitry 14 is switched from pseudo-1/n mode to 2/n mode two bus clocks after reset is sampled deasserted.

Figure 16:
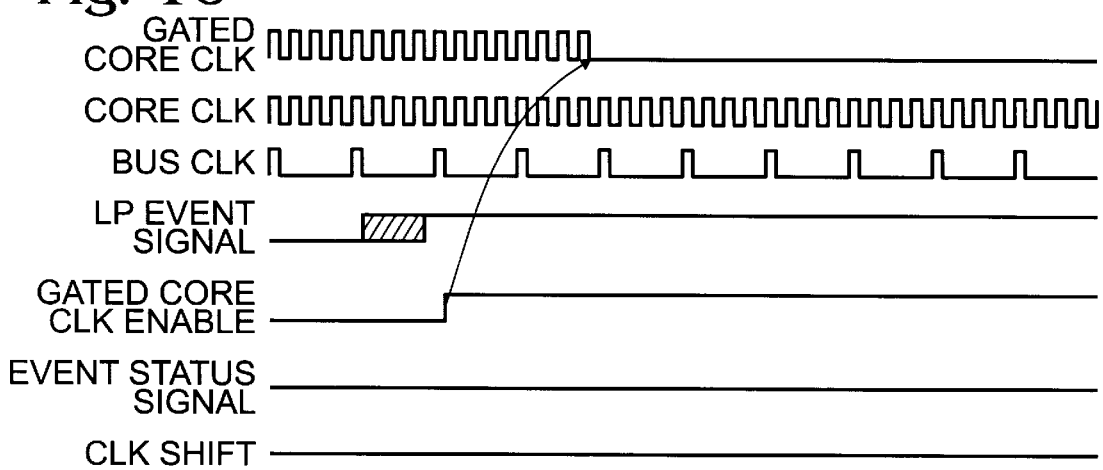
FIG. 16 is a graphical representation of signals of FIGS. 3, 10, and 11 while the processor goes to sleep in a 1/4 mode in some embodiments of the invention.
Figure 17:
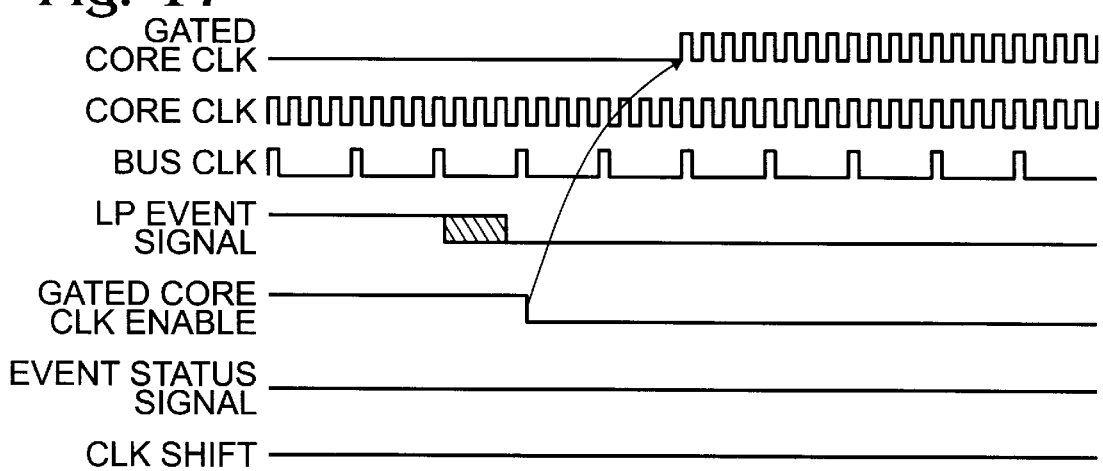
FIG. 17 is a graphical representation of signals of FIGS. 3, 10, and 11 while the processor wakes up in a 1/4 mode in some embodiments of the invention.
Figure 18:
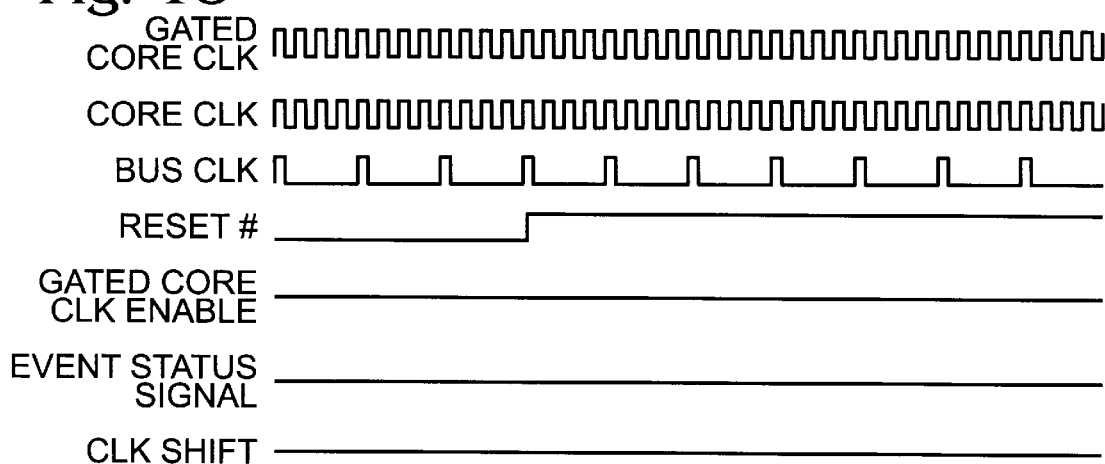
FIG. 18 is a graphical representation of signals of FIGS. 3, 10, and 11 while the processor is reset in a 1/4 mode in some embodiments of the invention.

As mentioned, in some embodiments, for 1/n modes, the event status signal is never asserted, so that no clock alignment happens. FIG. 16 and FIG. 17 show going into and out of the Sleep/Quick Start mode in 1/n mode. Gated core clock is turned off/on two bus clocks after the lower power event signal is asserted/deasserted. FIG. 18 shows leaving Reset in 1/n mode.

In FIG. 12, the following signals are shown as a function of time:

VCOclk
core clock
busclk
clkshift
clkshift'
XOR

Figure 19:
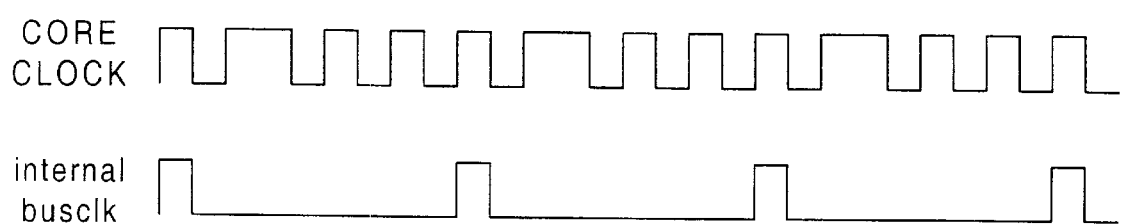
FIG. 19 is a graphical representation of core and busclk signals of FIG. 3 in which the core clock is stretched after the second rising edge according to some embodiments of the invention.
Figure 20:
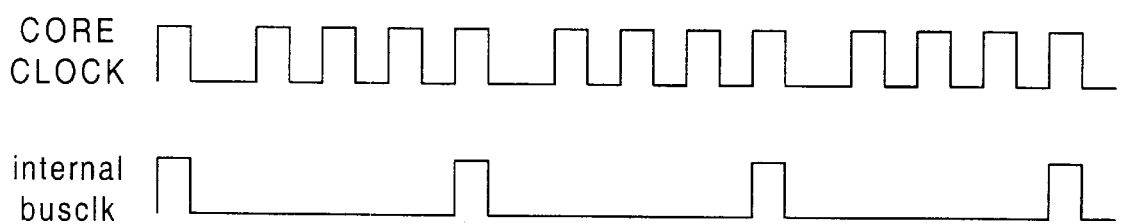
FIG. 20 is a graphical representation of core and busclk signals of FIG. 3 in which the core clock is stretched after a falling edge according to some embodiments of the invention.

In FIG. 13, the following signals are shown as a function of time:

gated core clock
to core clock
busclk
low power (LP) event signal
gated core clock enable
clkshift
event status signal In FIG. 14, the following signals are shown as a function of time:

gated core clock
core clock
busclk
LP event signal
gated core clock enable
event status signal
clkshift In FIG. 15, the following signals are shown as a function of time:

gated core clock
core clock
busclk
reset#
gated core clock enable
event status signal
clkshift In FIG. 16, the following signals are shown as a function of time:

gated core clock
core clock busclk
LP event signal
gated core clock enable
event status signal
clkshift In FIG. 17, the following signals are shown as a function of time:
gated core clock
core clock
busclk
LP event signal
gated core clock enable
event status signal
clkshift In FIG. 18, the following signals are shown as a function of time:
gated core clock
core clock
busclk
reset#
gated core clock enable
event status signal
clkshift Core clock generating circuitry 14 does not have to stretch the core clock between the first and second rising edges (as in, for example, FIG. 5). For example, in FIG. 19, the core clock is stretched after the second rising edge. In FIG. 20, the core clock is stretched between a falling and rising edge.

As used herein, the term processor is intended to be used broadly to include microprocessors and digital signal processors. The invention is not limited to inclusion in processors. The invention may be used in connection with other electronics circuits including, for example, chipsets.

The terms internal and external are not necessarily limited to internal to a die and externally to a die. For example, internal mean be internal to a section of a die and external could mean external to the section of the die.

Although 2/n and 1/n modes have been discussed, the invention may be used in connection with m/n modes, where m and n are positive integers. As an example, referring to FIG. 21, a circuit 150 includes a PLL 154 that receives an external clock as an input and produces an internal clock that has a frequency that is m/n of the external clock where m and n are positive integers that are relatively prime and m is greater than n. Under normal operation, every nth external clock rising edge is aligned with every mth internal clock rising edge. Without this invention, external logic (test logic for example) cannot know when this rising edge alignment happens, so the internal clock is non-deterministic. A PLL analog section 158 produces an oscillator clock that has a frequency that is m times the external clock frequency. This oscillator clock is divided by n in the PLL to produce the internal clock at the m/n frequency. In the suspend mode, the divide by n logic in the PLL stretches its output by a number of oscillator clock phases to produce a pseudo-m'/n internal clock where m' is a multiple of n. Every external clock is phase aligned with every m'th internal clock, making the internal clock deterministic in suspend mode. If an external signal is used to switch the PLL from suspend mode to normal operating mode, then the internal clock is deterministic in normal operating mode too.

Figure 21:
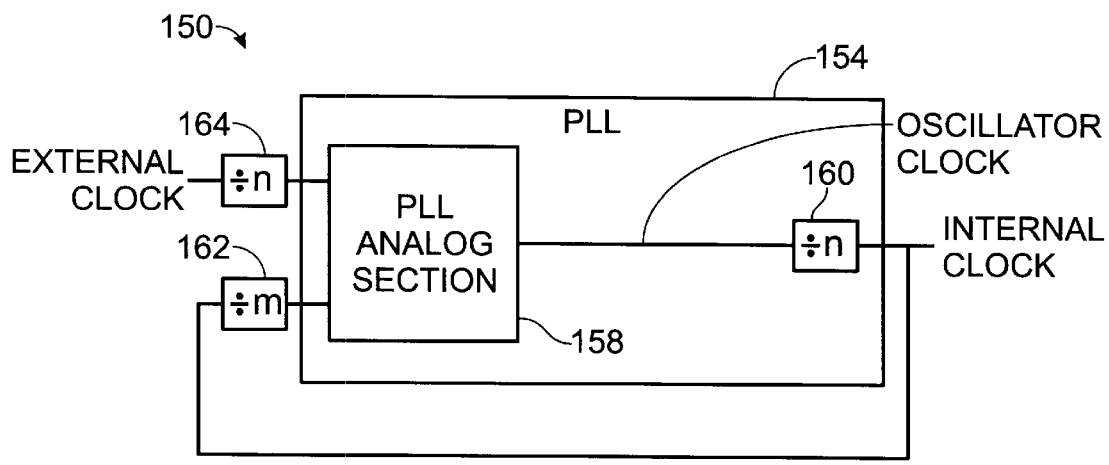
FIG. 21 is a schematic block diagram representation of circuitry for generalized m/n ratios according to some embodiments of the invention.

In FIG. 21, the oscillator clock is analogous to the VCOclock of FIG. 11. The PLL analog section is analogous to block 90 of FIG. 11. The PLL block is analogous to block 14 of FIG. 3. Divide by n block 160 within PLL 154 is analogous to everything in FIG. 11 except block 90. Divide by m block 162 and divide by n block 164 that is outside PLL 154 is not analogous to anything in FIGS. 3 or 11.

Advantages of embodiments of the invention include that it is simpler that the prior art to understand and describe and model in an automatic language such as RTL. In some embodiments, the alignment relationship is known even during, for example, Reset and after Deep Sleep. Vectors can be applied and have deterministic results even before any synchronizing event has occurred. It dramatically reduces the AC component of power dissipation of, for example, the Quick Start and Sleep modes. The gated core clock may be stopped and started on aligned edges, which facilitates transitions from 1/n to 2/n and vise versa.

In some embodiments, at least one rising edge of the internal bus clock signal is aligned with a rising edge of the external bus clock signal.

The processor might include the capability to wake up the gated core clock one bus clock earlier on a wake-up event (BPRI# assert, SLP# deassert) if desirable.

Each of flip flops 50, 70, 76, 80, and 88 may be asynchronously reset by a power good signal (pwrgood).

The phrase "some embodiments" refers to at least some embodiments of the invention. The various appearances "some embodiments" are not necessarily all referring to the same embodiments.

If the specification states a component, feature, structure, or characteristic "may", "might", or "could" be included, that particular component, feature, structure, or characteristic is not required to be included.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. A system having a normal operating mode and a suspend mode, the system comprising:
   event recognition circuitry to provide an event status signal; and
   clock generating-circuitry with selective stretching capability to generate an internal clock signal and to receive the event status signal, and wherein when the event status signal has a first logic state, the clock generating circuitry stretches the internal clock signal by a number of phases per cycle of a bus clock signal wherein an alignment relationship between the internal clock signal and the bus clock signal is immediately deterministic in transitions between the suspend mode and the normal operating mode.

2. The system of claim 1, wherein the alignment relationship between the internal clock signal and bus clock signal is deterministic in the suspend mode.

3. The system of claim 1, wherein the internal clock signal is stretched by an odd number of phases when the event status signal has the first logic state and a ratio of the internal clock signal to the bus clock signal is 2/n, where n is an odd integer.

4. The system of claim 1, wherein the internal clock signal is a core clock signal.

5. The system of claim 1, wherein the internal clock signal is stretched by an even number of phases when the event status signal has the first logic state and a ratio of the internal clock signal to the bus clock signal is 1/n, where n is an integer.

6. The system of claim 1, wherein a ratio of the internal clock signal to the bus clock signal is m/n, where m and n are positive integers.

7. The system of claim 6, wherein the event status signal has the first logic state when the ratio is 1/n.

8. The system of claim 1, wherein the suspend mode includes a low power mode.

9. The system of claim 1, wherein the suspend mode includes a powering up mode and there is more than one type of suspend mode.

10. The system of claim 1, wherein the system includes a processor and the event recognition circuitry and the clock generating circuitry are included in the processor.

11. The system of claim 1, wherein the system includes a chipset and the event recognition circuitry and the clock generating circuitry are included in the chipset.

12. The system of claim 1, wherein the event status signal has a single bit and the first logic state is a logic high voltage.

13. The system of claim 1, wherein when event state signal has a second logic state, the internal clock signal is not stretched.

14. A system having a normal operating mode and a suspend mode, the system comprising:
    event recognition circuitry to provide an event status signal; and
    clock generating circuitry with selective stretching capability to generate an internal clock signal and to receive the event status signal, and wherein when the event status signal has a first logic state, the clock generating circuitry stretches the internal clock signal by a number of phases per cycle of an external clock signal wherein an alignment relationship between the internal clock signal and the external clock signal is immediately deterministic in transitions between the suspend mode and the normal operating mode.

15. The system of claim 14, wherein the system includes a processor and the event recognition circuitry and clock generating circuitry are in the processor and wherein the internal clock signal is a core clock signal and the external clock signal is an external bus clock signal.

16. The system of claim 14, wherein a ratio of the internal clock signal to the external clock signal is m/n, where m and n are positive integers.

17. A method of providing an internal clock signal in circuitry having a normal operating mode and a suspend mode, comprising:
    receiving an event status signal; and
    stretching an internal clock signal by a number of phases per cycle of a bus clock signal during a suspend mode when the event status signal has a first logic state and wherein an alignment relationship between the internal clock signal and the bus clock signal is immediately deterministic in transitions from the suspend mode to the normal operating mode.

18. The method of claim 17, wherein the alignment relationship between the internal clock signal and bus clock signal is deterministic in the suspend mode.

19. The system of claim 17, wherein a ratio of the internal clock signal to the external clock signal is m/n, where m and n are positive integers.

20. The method of claim 17, wherein the bus clock signal is an internal bus clock signal.

21. The method of claim 17, wherein the internal clock signal is stretched by an odd number of phases when the event status signal has the first logic state and a ratio of the internal clock signal to the bus clock signal is 2/n, where n is an odd integer.

22. The method of claim 17, wherein the internal clock signal is stretched by an even number of phases when the event status signal has the first logic state and a ratio of the internal clock signal to the bus clock signal is 1/n, where n is an integer.

* * * * *